United States Patent [19]

Shimizu et al.

[11] 4,356,421

[45] Oct. 26, 1982

[54] PIEZOELECTRIC RESONATORS OF AN ENERGY-TRAPPING TYPE OF A WIDTH EXTENSIONAL VIBRATORY MODE

[75] Inventors: Hiroshi Shimizu, Sendai; Hiroshi Watanabe, Izumi, both of Japan

[73] Assignee: Tohoku Metal Industries, Ltd., Miyagi, Japan

[21] Appl. No.: 241,738

[22] Filed: Mar. 9, 1981

[30] Foreign Application Priority Data

Mar. 25, 1980 [JP] Japan .................. 55-36960
Mar. 25, 1980 [JP] Japan .................. 55-36961

[51] Int. Cl.³ ............................................. H01L 41/08
[52] U.S. Cl. ................................ 310/320; 310/365; 310/358; 310/368
[58] Field of Search ............... 310/320, 357, 358, 365, 310/366, 368, 370, 311; 333/186, 191

[56] References Cited

U.S. PATENT DOCUMENTS 3,488,530  1/1970  Staudte .................... 310/365 X
3,531,742  9/1970  Saito et al. ............... 310/366 X
3,699,484 10/1972  Berlincourt ............... 310/320 X

FOREIGN PATENT DOCUMENTS 52-18147  2/1977  Japan ....................... 310/365

OTHER PUBLICATIONS

Monolithic Ceramic Filters for VHF Band, by Nagata et al., JEE, Jan. 1977, pp. 54-57.

Primary Examiner—Mark O. Budd
Attorney, Agent, or Firm—Posnack, Roberts, Cohen & Spiecens

[57] ABSTRACT

A piezoelectric resonator of a width-extensional mode vibratory-energy trapping type having a rectangular piezoelectric plate of a width corresponding to a desired resonance frequency. Peripheral electrodes are deposited apart from one another in its lengthwise direction to cover over the width of opposite end portions of the piezoelectric plate in order to lower the cut-off frequency of the opposite end portions of the piezoelectric plate in comparison with the intervening central portion of the plate, so that the width-extensional mode vibratory energy may be trapped or confined within the central portion of the piezoelectric plate. The resonator can be supported and are connected to lead wires at peripheral electrodes.

In the piezoelectric plate polarized in its width direction, two excitation electrodes are provided on a surface of the central portion of the piezoelectric plate in parallel with one another, one connected with one of the peripheral electrodes and the other connected to the other peripheral electrode. A set of two excitation electrodes and two spaced peripheral electrodes may be formed on the reverse surface of the piezoelectric plate in registry with those electrodes on its opposite surface. A stray strip-like electrode may be formed between the two excitation electrodes of one surface of the piezoelectric plate. In the case, the stray electrode and two excitation electrodes are disposed so that centers of respective distances between respective adjacent electrode is corresponding to zero point of stress distribution due to the third-harmonic-mode vibration to suppress the third harmonic mode.

In the piezoelectric plate polarized in its thickness direction, four peripheral electrodes are formed on the opposite surfaces of the piezoelectric plate, and peripheral electrodes at each end portion are short-circuited with one another. Excitation electrodes are formed on the central exposed regions of the plate intervening between peripheral electrodes. Two excitation electrodes may be formed on each surface of the plate, and are disposed at positions corresponding to zero points of stress distribution due to the third-harmonic mode vibration to suppress the third-harmonic mode.

16 Claims, 32 Drawing Figures

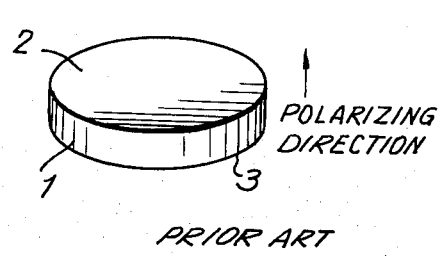
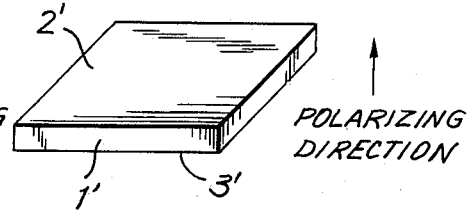
PRIOR ART
FIG.1a
PRIOR ART
FIG.1b
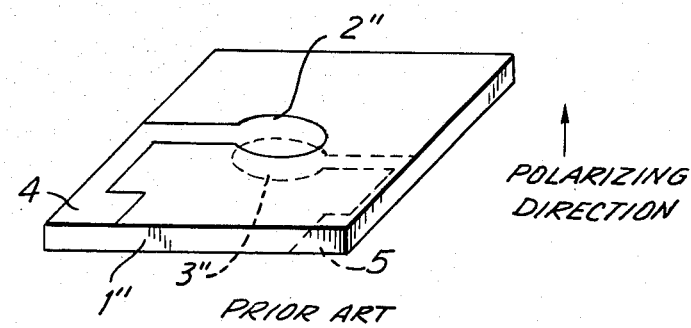
PRIOR ART
FIG.2
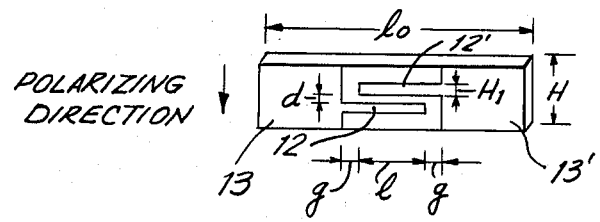
FIG.3

PIEZOELECTRIC RESONATORS OF AN ENERGY-TRAPPING TYPE OF A WIDTH EXTENSIONAL VIBRATORY MODE

BACKGROUND OF THE INVENTION

This invention relates to piezoelectric resonators used for filters, oscillators and others, and, in particular, to such resonators of an energy-trapping type.

As well known in the prior art, a piezoelectric resonator generally includes a piezoelectric plate and excitation electrodes deposited thereon. As the piezoelectric plate, various materials are known in the prior art, for example, $Pb(Zr-Ti)O_3$ ceramics, $BaTiO_3$ ceramics, $PbTiO_3$ ceramics, $LiNbO_3$ monocrystal, $LiTaO_3$ monocrystal and the like which are polarized in a direction. Quarts are typical piezoelectric materials which are not necessary to be polarized.

According to various resonance frequencies and frequency band widths desired in different applications, different vibratory modes, such as longitudinal vibratory mode, contour mode, thickness mode and others, of the piezoelectric plate are selectively used.

Generally speaking, a mode, such as a contour mode of a square plate or a circular disk or a longitudinal vibratory mode of a rectangular plate, where the entire body of the plate vibrates, is used for a resonator having a comparatively low resonance frequency such as lower than 2 or 3 MHz. On the other hand, a thickness vibratory mode is used for a resonator having a comparatively high resonance frequency such as in range of 2 or 3 MHz to several ten megahertz.

In thickness-vibratory mode resonators, the vibratory-energy trapping, that is, confining the vibratory energy to a limited region of the piezoelectric plate is used by forming excitation electrodes on the limited region of the plate, or by decreasing the thickness of the plate portion surrounding the limited electroded region, as disclosed in, for example, "Analysis of Piezoelectric Resonators Vibrating in Trapped-Energy Modes" described by M. Onoe and H. Jumonji in Electronics and Communications Engineering (Japan) Vol. 48 number 9, Sept. 1965, pp. 85–93, "Trapped-Energy Modes in Quarts Filter Crystals" described by W. Shockley, D. R. Curran, and D. J. Koneval in The Journal of the Acoustic Society of America, Vol. 41, Part 2, Apr. 1967, pp. 981–993, U.S. Pat. Nos. 3,384,768, and 3,676,724, and others.

It is well known in the art that energy-trapped mode resonators have various advantages. That is, any spurious vibration is effectively suppressed, and the non-vibratory peripheral portion of the resonator is used for lead-wire connection and mechanical support of the resonator without any affection to vibration of the resonator. On the contrary, a resonator using such a mode that its entire body vibrates as described above has problems in lead-wire connection, support of the resonator and others.

It is, therefore, desired that the energy-trapped mode is used for such a resonator having a comparatively low resonance frequency. However, use of the thickness-vibratory mode for such a low frequency resonator requires use of a large piezoelectric plate having an increased thickness, so that the volume of the resonator is undesirably increased. While, it is impossible to trap such a longitudinal vibratory energy or a contour vibratory energy to a limited region of the piezoelectric plate, for example, by limiting the electroded region of the piezoelectric plate.

SUMMARY OF THE INVENTION

Accordingly, it is an object of this invention to provide an energy-trapped mode piezoelectric resonator having a comparatively low resonance frequency below about 3 MHz, wherein the problems in lead-wire connection and support of the resonator are resolved.

It is another object of this invention to provide an energy-trapped mode piezoelectric resonator using a width-extensional vibratory mode.

It is still another object of this invention to provide an energy-trapped mode piezoelectric resonator using a width-extensional vibratory mode, wherein the third harmonic mode of the vibration is effectively suppressed.

It is yet another object of this invention to realize the above described objects with a simple structure, simple production method and low cost.

An energy-trapped mode piezoelectric resonator of this invention comprises a lengthy rectangular piezoelectric plate having a width determined by a desired resonance frequency.

According to an aspect of this invention, the piezoelectric plate is polarized in its width direction. The plate is provided with two peripheral electrodes on a surface of the plate which are spaced in the lengthwise direction to remain an intervening exposed region. A first strip of electrode is extended on the exposed region from one of the peripheral electrodes in a lengthwise direction of the plate, and a second strip of electrode is also extended on the exposed region from the other peripheral electrode in parallel with, but apart from, the first strip-like electrode. The first and second strip-like electrodes serve as excitation electrodes and the peripheral electrodes are connected to lead wires for connecting to external circuits. When an exciting signal is fed to the strip-like excitation electrodes through the lead wires and the peripheral electrodes, the piezoelectric plate vibrates and resonates at the resonance frequency in the width-extensional mode.

The length of the piezoelectric plate is advantageously about ten times of its width or more. The space between the separated peripheral electrodes is advantageously two or three times of the width of the piezoelectric plate. A distance between first and second strip-like excitation electrodes is determined one half of the width of the piezoelectric plate or less. The gap from an extended end of each strip-like excitation electrode to the opposite peripheral electrode is larger than the distance between the excitation electrodes. The ratio of the width of each strip-like excitation electrode to the width of the plate is advantageously about 1/5 or less.

In order to suppress the third harmonic mode of the resonance frequency, a strip of stray electrode is formed on the exposed region to extend between the first and second excitation electrodes but to be connected with no electrode. These three parallel strip-like electrodes are disposed so that centers between respective adjacent electrodes may be positions on the plate corresponding to zero points of stress distribution due to the third-harmonic-mode width extensional vibration.

On the reverse surface of the plate, similar peripheral electrodes may be formed in registry with, and short-circuited to, those peripheral electrodes on opposite surface. And similar excitation electrodes and/or stray electrode may also be provided on the reverse surface in symmetry with those electrodes on the opposite surface.

According to another aspect of this invention, the piezoelectric plate is polarized in its thickness direction. The plate is provided with a pair of first and second peripheral electrodes on a surface of the plate and another pair of third and fourth peripheral electrodes on the other surface of the plate. Two electrodes of each pair are spaced in the lengthwise direction to remain intervening exposed region. The first peripheral electrode is short-circuited with the third peripheral electrode at a same end portion of the piezoelectric plate but on the opposite surface of the plate, while the second peripheral electrode is short-circuited with the fourth peripheral electrode at the opposite end portion but on the opposite surface of the plate. A first strip of electrode is extended on the exposed region from the first peripheral electrode on one surface of the plate in a lengthwise direction of the plate. A second strip of electrode is also extended on the exposed region of the opposite surface of the plate from the fourth peripheral electrode in the opposite lengthwise direction. The first and second strip-like electrodes are in parallel with one another on the opposite surfaces of the plate and serve as excitation electrodes. The peripheral electrodes are connected to lead wires for connection to external circuits. When an exciting signal is fed to the strip-like excitation electrodes through the lead wires and the peripheral electrodes, the piezoelectric plate vibrates and resonates at the resonance frequency in the width-extensional mode.

The length of the piezoelectric plate is advantageously about ten times of its width or more. The space between the separated peripheral electrodes of each pair is advantageously about two or three times of the width of the piezoelectric plate. The gap from an extended end of each strip-like electrode to the opposite peripheral electrode is larger than the thickness of the plate. The ratio of the width of each strip-like electrode to the width of the plate is advantageously about ½ or less.

Two strip-like electrodes may be formed on each surface of the plate in parallel with one another, at positions corresponding to zero points of stress distribution due to the third-harmonic-mode width-extensional vibration. In the arrangement, the third-harmonic mode of the resonance frequency is suppressed.

Further objects, features and other aspects of this invention will be understood from the following detailed description of preferred embodiments of this invention referring to the annexed drawings.

BRIEF DESCRIPTION OF THE DRAWINGS

FIGS. 1a and 1b are perspective views of different known 455 KHz ceramic resonators;

FIG. 2 is a perspective view of a known energy-trapped mode resonator;

FIG. 3 is a perspective view for illustrating an electrode arrangement for trapping width-vibratory energy of an elongated piezoelectric plate polarized in its width direction;

DETAILED DESCRIPTION OF PREFERRED EMBODIMENTS

Figure 4:
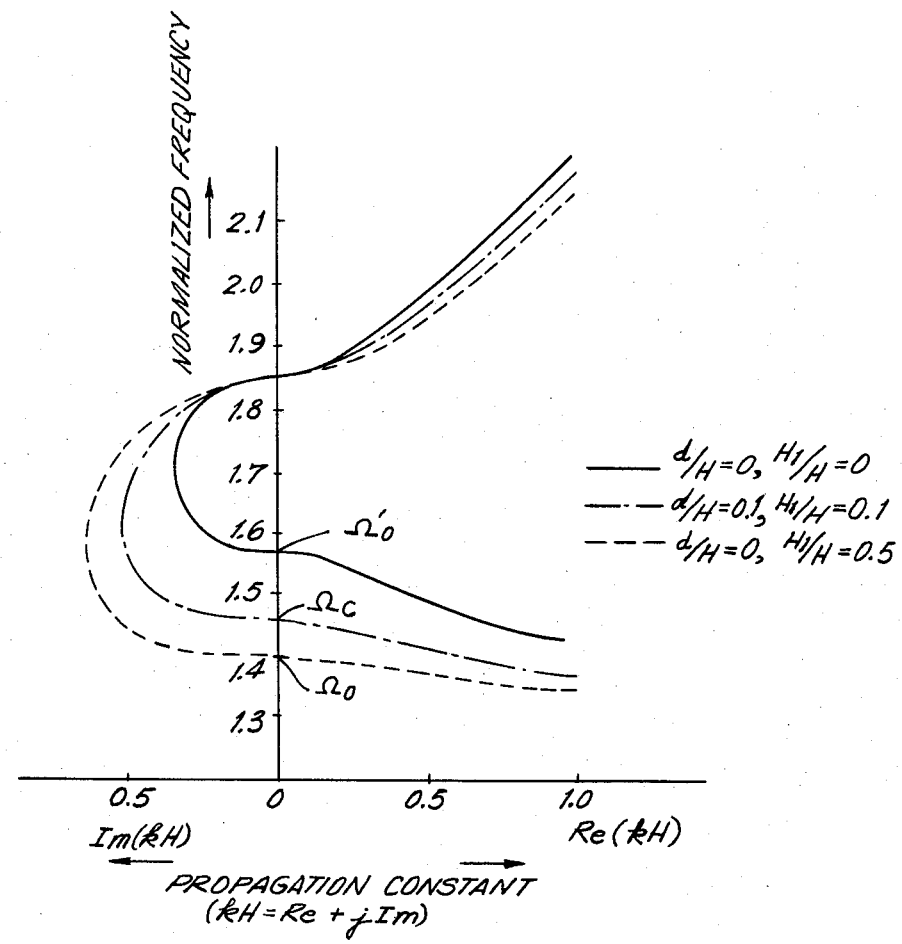
FIG. 4 shows a variance of the dispersion curve of the width-extensional mode in the plate shown in FIG. 3, in dependence on the variation of the ratio $H_1/H$ of electrode widths to the plate width.

FIGS. 1a and 1b shows examples of ceramic resonators for 455 KHz ceramic filters used in IF-amplifier circuits in AM-radio receivers. The resonator shown in FIG. 1a includes a circular ceramic disk 1 and electrodes 2 and 3 deposited on its entire both surfaces. Disk 1 is polarized in its thickness direction and has a diameter of about 5 mm. FIG. 1b shows a resonator including a square ceramic plate 1' and electrodes 2' and 3' deposited on its entire both surfaces. Plate 1' is polarized in its thickness direction and the length of its each side is about 4.7 mm. The vibratory mode of each one of resonators in FIGS. 1a and 1b is a contour vibratory mode, with the center being a node of the vibration.

In these resonators, support of the resonator and taking out of electric terminals are made by pressing metal terminal plates onto the both sides of the resonator at its center corresponding to a node of the vibration. Another known method is to fix lead wires by solder agent to the resonator at its center corresponding to a node of the vibration.

The former has problems in reliability because the electrodes are apt to fall off at portions pressed by the terminal plates and because the electrical connection between each electrode and each terminal plate is apt to fail due to the mechanical vibration. The latter has such faults that the fixing operation of lead wires is difficult and that the support is apt to affect to the property of the resonator.

FIG. 2 shows an energy-trapped mode resonator having a resonance frequency of 10.7 MHz. The resonator including a square ceramic plate 1" polarized in the thickness direction. The thickness is about 0.2 mm and the length of each one side is about 5 mm. Circular electrodes 2" and 3" of a diameter of about 1.5 mm are formed on the opposite surfaces at its center portions. Terminal electrodes 4 and 5 are formed on the both surfaces to extend from respective circular electrodes 2" and 3" to peripheral edges of the plate. In the arrangement, since the thickness-mode vibratory energy is trapped in the electroded region of the circular electrodes 2" and 3", the peripheral portion of the resonator does not relate to the vibration. Therefore, the resonator can be supported at its peripheral portion and lead wires can be connected to the peripheral electrodes, without any affection to the vibratory mode.

In order to resolve the problems in resonators of comparatively low resonance frequencies, the application of the energy-trapped mode is thought. However, if an energy-trapped mode resonator of a resonance frequency of 2 MHz is made, a circular ceramic disk of a thickness of about 1.0 mm and a diameter of about 20 mm. Thus, the dimension of the resonator is increased as the resonance frequency is lowered. Accordingly, it is undesired to make resonators of comparatively low resonance frequencies of thickness-vibratory trapped modes.

It is impossible to apply the energy-trapping arrangement to contour-mode resonators.

This invention attempts to trap the vibratory energy of a width-extensional mode.

Since the dispersion characteristic of the thickness mode and that of the width-extensional mode are generally substantially different, the arrangement of the energy trapping of the thickness mode cannot be applied to the energy trapping of the width-extensional mode. The resonator of a thickness mode has generally a frequency dispersion characteristic of, so called, a low frequency band blocking type, that is, vibratory energy of frequencies below the cut-off frequency is blocked. On the other hand, the vibratory energy of frequencies above the cut-off frequency is generally blocked in the resonator of a width-extensional mode, that is, the width-extensional mode presents, so called, a frequency dispersion characteristic of a high frequency band blocking type.

Therefore, even if electrodes are formed on limited regions of the opposite surfaces of a piezoelectric plate which has a width corresponding to a desired resonance frequency similar to the known energy-trapped mode resonator in the thickness mode, the vibrating energy cannot be trapped.

After our experiments, we obtained our knowledges as follows:

Referring to FIG. 3, when a lengthy rectangular piezoelectric plate 11 of a length $l_0$ and a width H which is polarized in the width direction is provided with a peripheral electrodes 13 and 13' formed on a surface thereof at opposite end portions spaced by a distance $(l+2g)$ from one another in the lengthwise direction, with a pair of strip-like electrodes 12 and 12' of a width $H_1$ formed to extend from respective peripheral electrodes 13 and 13' on the exposed region between the peripheral electrodes 13 and 13', it is ascertained that a relation between the normalized frequency ($\omega H/v$: $\omega$=an angular frequency of the vibration, and v=an acoustic velocity) and a propagation constant (kH=Re(kH)+jIm(kH)) changes depending on differences of the ratios of $H_1/H$ and $d/H$ as shown in FIG. 4. In FIG. 4, intersections $\Omega_0$, $\Omega_c$, and $\Omega'_0$ between the vertical axis and respective curves give cut-off frequencies. Accordingly, it is noted from FIG. 4 that the cut-off frequency of the width-extensional mode resonator can be controlled by changing the ratios of $H_1/H$ and $d/H$. It is also noted from FIG. 4 that the cut-off frequency at a portion of the plate having the strip-like electrodes 12 and 12' is higher than that of the other peripheral portions having the peripheral electrodes 13 and 13'. Accordingly, the vibratory energy of the width-extensional mode can be trapped or confined within the region between the peripheral electrodes 13 and 13'.

Figure 5:
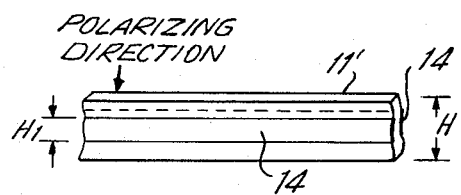
FIG. 5 is a perspective view of an elongated piezoelectric plate polarized in its thickness direction, with longitudinal electrodes formed on its both surfaces.
Figure 6:
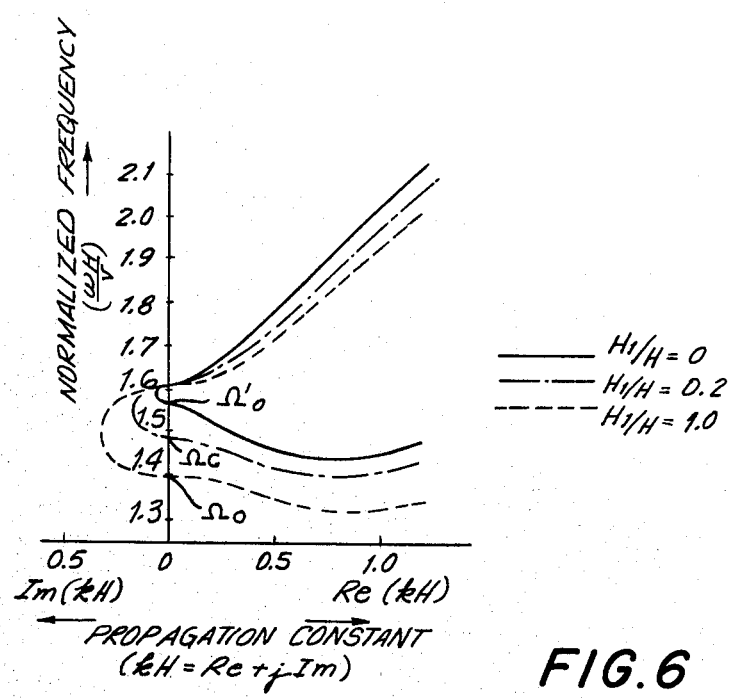
FIG. 6 shows a variance of the dispersion curve of the width-extensional mode in the plate shown in FIG. 5, in dependence on the variation of the ratio $H_1/H$ of electrode widths to the plate width.

Furthermore, referring to FIG. 5, when electrodes 14 and 14' of a width $H_1$ are deposited onto the opposite surface of a piezoelectric plate 11' of an indefinite length and width H which is polarized in the thickness direction, a relation between the normalized frequency $\omega H/v$ and the propagation constant kH changes depending on the ratio of $H_1/H$ as shown in FIG. 6. It is noted from FIG. 6 that the cut-off frequency is elevated as the ratio of $H_1/H$ is lowered.

This invention is based on the new knowledge as described above.

Figure 7A:
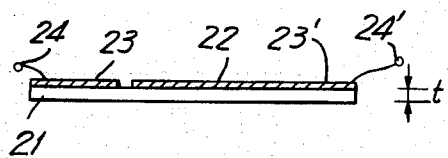
FIGS. 7a, 7b, and 7c show a resonator of an embodiment of this invention, FIG. 7a being a sectional view taken along a line A—A' in FIG. 7b, FIG. 7b being a top view and FIG. 7c being a bottom view.
Figure 7B:
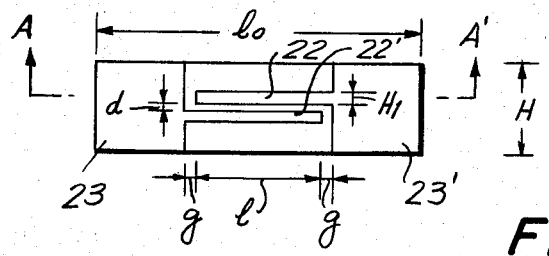
Figure 7C:
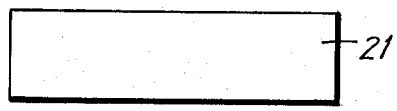

Referring to FIGS. 7a–7c, an embodiment shown in the figures includes a piezoelectric plate 21, a pair of excitation electrodes 22 and 22' and a pair of peripheral electrodes 23 and 23'. Piezoelectric plate 21 is of PbTiO$_3$ ceramics and in a form of lengthy rectangle of a length $l_0$, a thickness of t and a width of H corresponding to a desired resonance frequency. Plate 21 is polarized in the width direction. The pair of peripheral electrodes 23 and 23' are apart from one another by $(l+2g)$ and are formed on surface of the plate 21 to cover over the width of its opposite end portions. The pair of strip-like excitation electrodes 22 and 22' are formed on the exposed region of the plate 21 intervening between the pair of peripheral electrodes 23 and 23', and extend from respective peripheral electrodes 23 and 23' oppositely in the lengthwise direction. The width $H_1$ of each strip-like excitation electrode of 22 and 22' is narrower than the width H of piezoelectric plate 21. The distance between the pair of strip-like excitation electrodes 22 and 22' is d which is determined H/2 or less. The extending length of each strip-like excitation electrodes of 22 and 22' is $(l+g)$, l being about two or three times of H.

Lead wires 24 and 24' are fixed to peripheral electrodes 23 and 23'.

In the arrangement, when an exciting signal is applied to excitation electrodes 22 and 22' through peripheral electrodes 23 and 23' and lead wires 24 and 24', the resonator vibrates in the width mode. The vibratory energy of the width-extensional mode is trapped within the intervening region between the peripheral electrodes 23 and 23', as was already described in connection with FIGS. 3 and 4. Accordingly, lead-wire connection and support of the resonator can be made at the peripheral electrodes of the opposite end of the plate without affection to the vibratory mode.

Figure 8A:
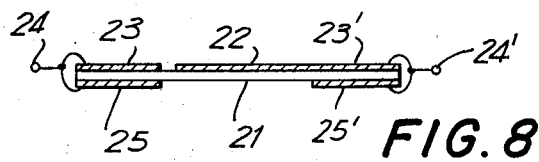
FIGS. 8a, 8b, and 8c show a modification, FIG. 8a being a sectional view taken along a line A—A' in FIG. 8b, FIG. 8b being a top view and FIG. 8c being a bottom view.
Figure 8B:
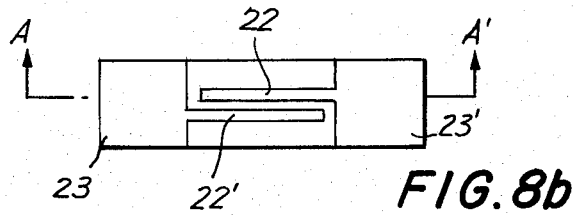
Figure 8C:
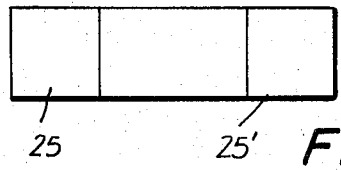

FIGS. 8a–8c shows a modification of the embodiment in FIGS. 7a–7c. Another pair of peripheral electrodes 25 and 25' are formed on the opposite surface of the plate 21 in registry with the pair of peripheral electrodes 23 and 23', respectively. Peripheral electrodes 25 and 25' are short-circuited to peripheral electrodes 23 and 23', respectively.

Figure 9A:
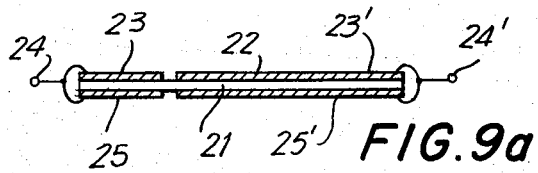
FIGS. 9a, 9b, and 9c show another modification, FIG. 9a being a sectional view taken along a line A—A' in FIG. 9b, FIG. 9b being a top view and FIG. 9c being a bottom view.
Figure 9B:
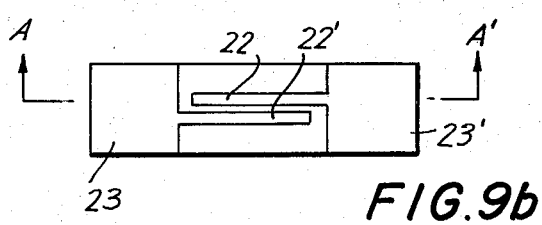
Figure 9C:
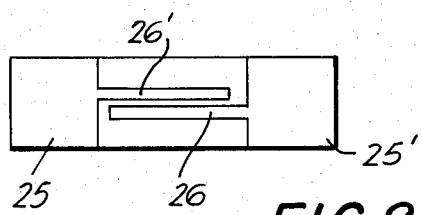
Figure 10:
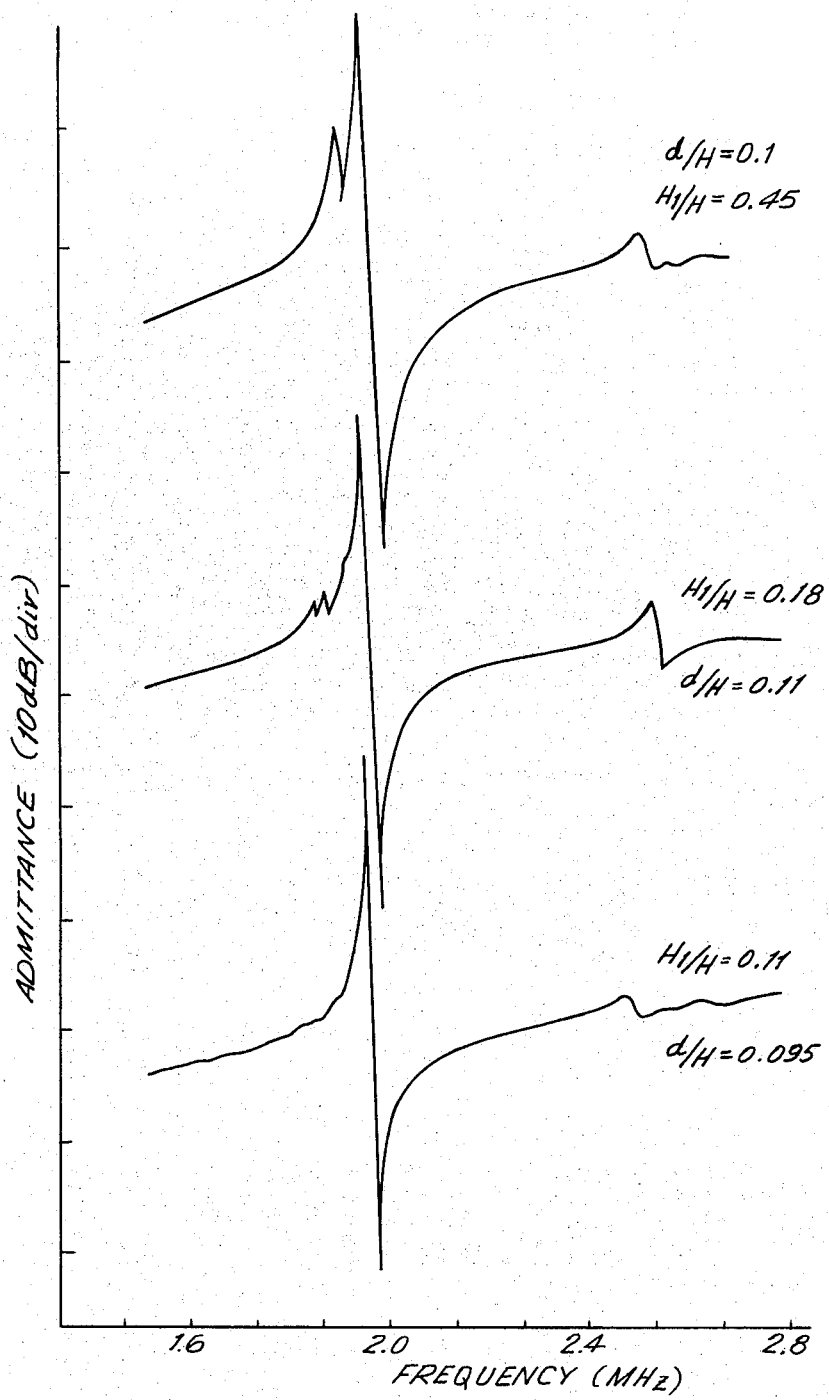
FIG. 10 shows different frequency-admittance responses of the resonators having different dimensions according to the arrangement in FIGS. 9a–9c.

FIGS. 9a–9c shows another modification wherein another strip-like electrodes 26 and 26' are formed on the opposite surface of the plate 21 in registry with the pair of strip-like excitation electrodes 22 and 22'. A frequency-admittance response of the resonator having a resonance frequency of 2 MHz according to the arrangement as shown in FIGS. 9a–9c, is shown in FIG. 10. In the case, respective dimensions of the resonator are as follows: H=1.05 mm, t=0.2 mm, d=0.1 mm, g=0.3 mm, $l_0$=10 mm, and l=3.35 mm. $H_1/H$ is changed to be 0.45, 0.18 and 0.11.

This dimensions are compared with those of the above described resonator of a thickness-vibratory energy-trapped mode.

It is noted from FIG. 10 that, if $H_1/H$ is 0.2 or less, any undesired vibration near the resonance frequency is removed so that a sharp and clean resonance characteristic may be obtained.

Similar results can be obtained in the arrangements as shown in FIGS. 7a–7c, and FIGS. 8a–8c.

In the above described embodiments, a pair of strip-like excitation electrodes 22 and 22' are arranged in symmetry with a longitudinal center axis of the plate 21, as shown in FIGS. 7a–7c.

Figure 11A:
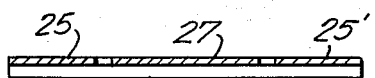
FIGS. 11a–11c show another embodiment, FIG. 11a being sectional view, FIG. 11b being a top view and FIG. 11c being a stress-distribution due to the third-harmonic-mode width-extensional vibration.
Figure 11B:
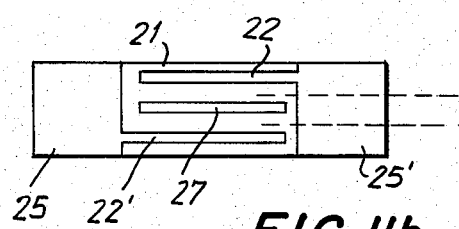
Figure 11C:
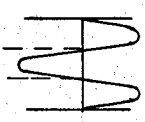

Referring to FIGS. 11a–11c, a stray electrode 27 is formed in parallel with, and between, strip-like excitation electrodes 22 and 22' on the ceramic plate 21. Stray electrode 27 is not connected to any one of peripheral electrodes 25 and 25'.

Figure 12A:
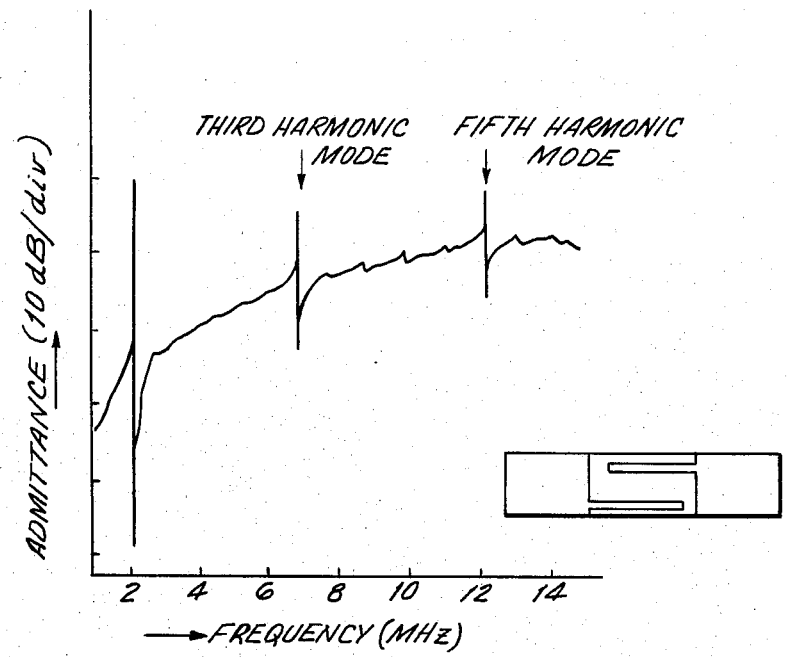
FIGS. 12a and 12b are frequency-admittance responses of different resonators illustrated in the figures.
Figure 12B:
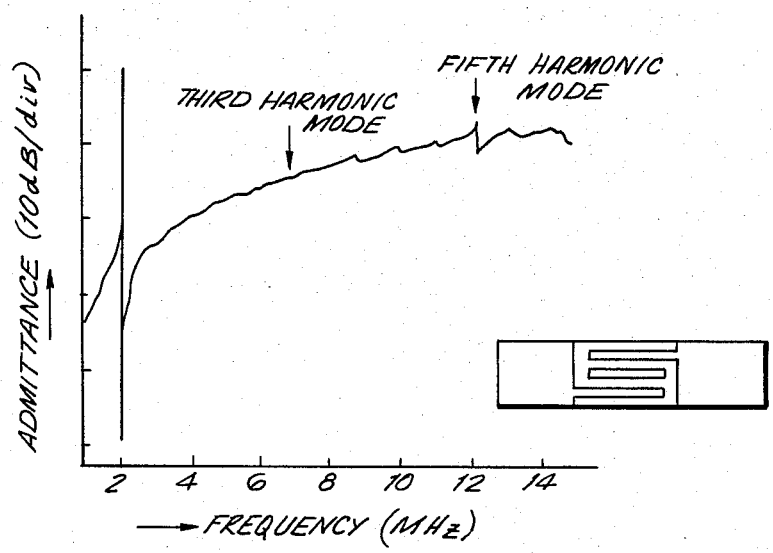

In this arrangement, strip-like electrodes 22, 22' and 27 may be disposed at positions corresponding to zero points of stress distribution due to the third-harmonic-mode width vibration, as shown in FIG. 11c. As a result, the third-harmonic mode can be suppressed. This is noted from FIGS. 12a and 12b. The third-harmonic mode is seen in the frequency-admittance response of the resonator without the stray electrode, as shown in FIG. 12a. However, it is removed in the frequency-admittance response of the resonator with the stray electrode, as shown in FIG. 12b.

Figure 13A:
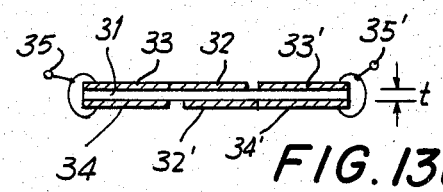
FIGS. 13a–13c show a resonator of another embodiment of this invention, FIG. 13a being a sectional view, FIG. 13b being a top view, and FIG. 13c being a bottom view.
Figure 13B:
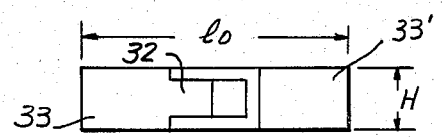
Figure 13C:
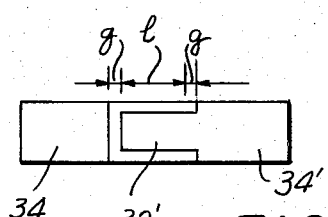

Referring to FIGS. 13a–13c, another embodiment of this invention includes a rectangular Pb(Zr-Ti)O$_3$ ceramic plate 31 of a length of $l_0$ and a width of H corresponding to the desired resonance frequency which is polarized in its thickness direction. A pair of first and second peripheral electrodes 33 and 33' are formed on a surface of plate 31 at its opposite end portions to be apart from one another by (l+2 g). Another pair of third and fourth peripheral electrodes 34 and 34' are formed on the opposite surface of plate 31 in registry with first and second peripheral electrodes 33 and 33', respectively. First peripheral electrode 33 is short-circuited with third peripheral electrode 34 in registry therewith and second peripheral electrode 33' is also short-circuited with fourth peripheral electrode 34' in registry therewith. A first strip-like electrode 32 of a width of $H_1$ is formed to extend from first peripheral electrode 33 by (l+g) on the intervening exposed region of plate 31 between first and second peripheral electrodes 33 and 33'. A second strip-like electrode 32' of a width of $H_1$ is also formed to extend from fourth peripheral electrode 34' (l+g) on the intervening exposed region of plate 31 between third and fourth peripheral electrodes 34 and 34'. Lead wires 35 and 35' are fixed to peripheral electrodes 33 and 33', respectively.

The width $H_1$ of each strip-like electrode of 32 and 32' is narrower than the width H of plate 31. The length l is about two or three times of H. The gap g between the extended end of each strip-like electrode of 32 and 32' and each adjacent peripheral electrode of 33' and 34' is determined larger than the thickness of the plate.

In the arrangement, when an exciting signal is applied to strip-like electrodes 32 and 32' through lead wires 35 and 35' and peripheral electrodes 33 and 34', the resonator vibrates in the width-extensional mode. The width-extensional mode vibratory energy is trapped within the intervening region between peripheral electrodes 33–34' because the width $H_1$ of strip-like excitation electrodes 32 and 32' is narrower than the width H of peripheral electrodes 33–34', and because the cut-off frequency at the peripheral portions of the plate is lower than that at the intervening portion, as will be understood from the description in connection with FIGS. 5 and 6. Accordingly, lead-wire connection and support of the resonator can be made at the peripheral electrodes of the opposite end of the plate without affection to the vibratory mode.

Figure 14:
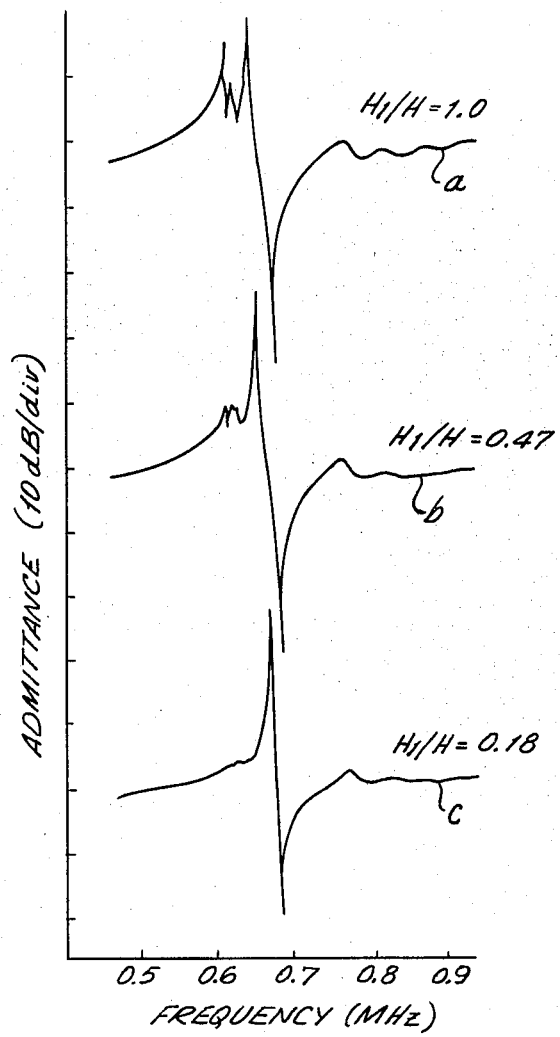
FIG. 14 shows different frequency-admittance responses of resonators having different dimensions according to the arrangement in FIGS. 13a–13c.

A resonator of 2 MHz according to the arrangement as shown in FIGS. 13a–13c is made and a measured frequency-admittance response is shown in FIG. 14. Dimensions of the resonator are as follows: H=2.63 mm, $l_0$=30 mm, t=0.2 mm, l=5.44 mm and g=0.55 mm. $H_1/H$ is changed to be 1.0, 0.47 and 0.18, which are corresponding to curves a, b and c in FIG. 14.

This dimension of the resonator is compared with that of the above described resonator of a thickness-vibratory energy-trapped mode.

It is understood from FIG. 14 that, if $H_1/H$ is 0.5 or less, a sharp and clean resonance characteristic is realized without any undesired vibration near the resonance frequency.

Figure 15A:
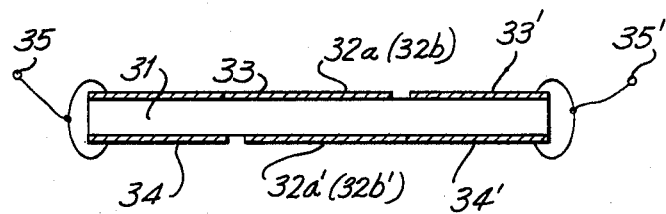
FIGS. 15a–15c show a modification, FIG. 15a being a sectional view, FIG. 15b being a top view, and FIG. 15c being a stress-distribution due to the third-harmonic-mode width-extensional vibration.
Figures 15B, 15C:
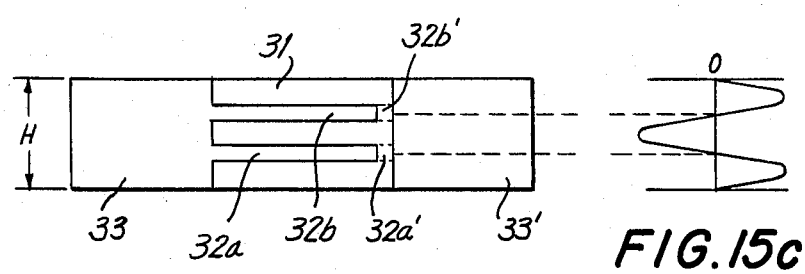

A modification of FIGS. 13a–13c is shown in FIGS. 15a–15c, wherein two strip-like excitation electrodes 32a and 32b and 32'a and 32'b are formed in parallel with one another on each surface of plate 31. In the arrangement, excitation electrodes 32a–32'b are disposed at positions corresponding to zero points of stress distribution due to the third-harmonic-mode width-extensional vibration, so that the third harmonic mode is suppressed.

Figure 16A:
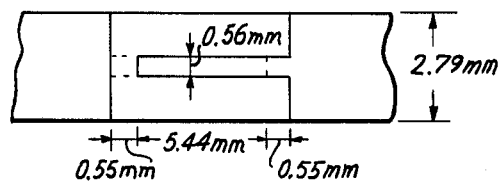
FIGS. 16a and 16b are top views of different resonators according to this invention.
Figure 16B:
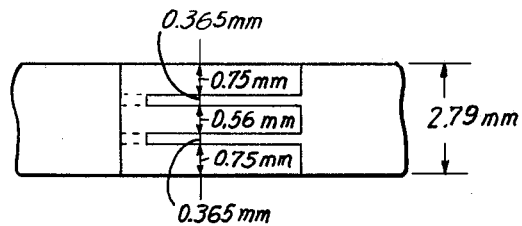
Figure 17:
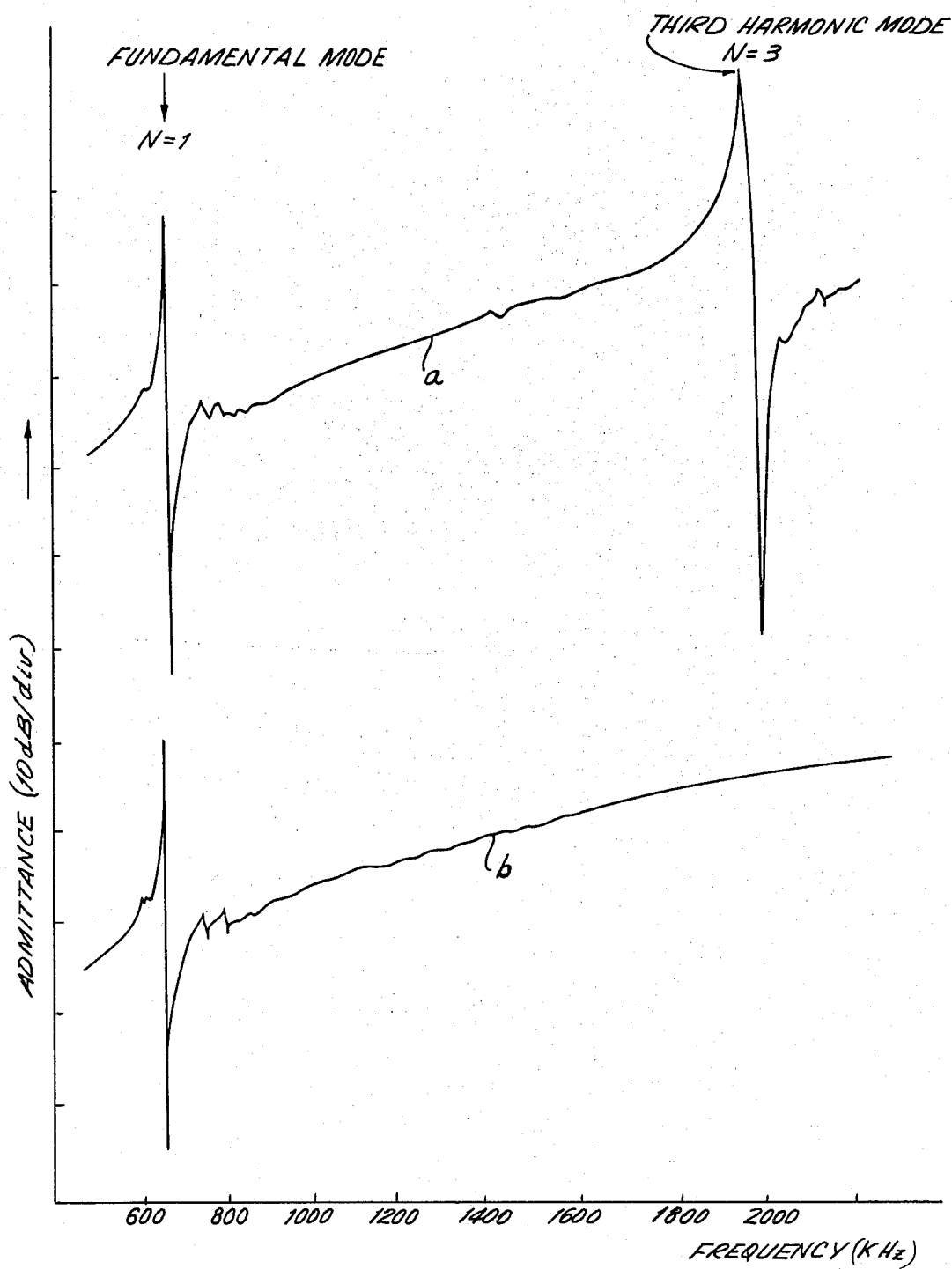
FIG. 17 shows the frequency-admittance responses of resonators in FIGS. 16a and 16b.

A frequency-admittance response was measured as to two kinds of resonators shown in FIGS. 16a and 16b according to arrangements in FIGS. 13a–13c and FIGS. 15a–15c, respectively. Dimensions of various parts are as described in the figures. The length of the used ceramic plate is 30 mm and its thickness is 0.2 mm. The measured frequency-admittance response is shown in FIG. 17. A curve a is a frequency-admittance response of the resonator in FIG. 16a and a curve b is a frequency-admittance response of the resonator in FIG. 16b. It is noted from FIG. 17 that the third-harmonic mode in the resonator of FIG. 16a is removed by the arrangement of FIG. 16b.

As the piezoelectric plate, various known piezoelectric substances such as Pb(Zr-Ti)O$_3$ ceramics, BaTiO$_3$ ceramics, PbTiO$_3$ ceramics, LiNbO$_3$ monocrystal, LiTaO$_3$ monocrystal or the like, can be used.

As various electrodes, Al, Cu, Ag, and/or Au can be used. Electrode is formed on the piezoelectric plate by a known method such as evaporating, sputtering, plating or the like.

What we claim is:

1. A piezoelectric resonator of an energy-trapping type of a width-extensional mode comprising:

a lengthy rectangular piezoelectric plate polarized in a direction perpendicular to the lengthwise direction thereof, said plate having a width determined by a predetermined resonance frequency;

at least one pair of first and second elongated excitation electrode means having a width narrower than said width of said plate and formed on a central portion of said piezoelectric plate to extend in the lengthwise direction of said plate in parallel with one another and apart from one another by a distance in said polarizing direction;

first peripheral electrode means formed on, and over the width of, one end portion of the surface of said piezoelectric plate on which said first excitation electrode means is formed, said first peripheral electrode means connected to a lead wire means;

first portion extended from said first excitation electrode means towards said first peripheral electrode means to connect therebetween;

second peripheral electrode means formed on, and over the width of, the other end portion of the surface of said piezoelectric plate on which said second excitation electrode means is formed, said second peripheral electrode connected to another lead wire; and second portion extended from said second excitation electrode means towards said second peripheral electrode means to connect therewith.

2. A piezoelectric resonator as claimed in claim 1, wherein said piezoelectric plate is one of selected from Pb(Zr-Ti)O$_3$ ceramic plate, BaTiO$_3$ ceramic plate, PbTiO$_3$ ceramic plate, LiNbO$_3$ monocrystal plate, and LiTaO$_3$ monocrystal plate.

3. A piezoelectric resonator as claimed in claim 1, wherein said piezoelectric plate is polarized in its width direction, said first and second excitation electrode means and said first and second peripheral electrode means are formed on a surface of said piezoelectric plate.

4. A piezoelectric resonator as claimed in claim 3, which further comprises an elongated additional stray electrode means formed on the surface of said piezoelectric plate to extend between, and in parallel with, said first and second excitation electrode means.

5. A piezoelectric resonator as claimed in claim 4, wherein said first and second excitation electrode means and said additional stray electrode means are disposed so that centers of distances of respective adjacent electrodes are consistent with positions corresponding to zero points of the stress distribution due to the third-harmonic mode width-extensional vibration.

6. A piezoelectric resonator as claimed in claim 3, which further comprises additional third and fourth electrode means formed additionally on the other surface of said piezoelectric plate to be in registry with said first and second peripheral electrode means, respectively, said third and fourth additional electrode means short-circuited to said first and second peripheral electrode means, respectively.

7. A piezoelectric resonator as claimed in claim 6, which further comprises two third and fourth elongated excitation electrode means additionally formed on the other surface of said piezoelectric plate to be in registry with said first and second excitation means, respectively, third portion extended from said third excitation electrode means to connect to said third additional electrode means, and fourth portion extended from said fourth excitation electrode means to connect to said fourth additional electrode means.

8. A piezoelectric resonator as claimed in claim 3, wherein the length of said piezoelectric plate is about ten times of its width or more, the space between said spaced first and second peripheral electrode means being about two or three times of the width of said piezoelectric plate, and the ratio of the width of each excitation electrode means to that of said piezoelectric plate being about 1/5 or less.

9. A piezoelectric resonator as claimed in claim 7, wherein said piezoelectric plate is a PbTiO$_3$ ceramic plate, with a ratio of the width of said ceramic plate and the width of each one of said excitation electrode means being 0.2 or less, the width of said ceramic plate being 1.05 mm, the length of said ceramic plate being 10 mm, the thickness of said ceramic plate being 0.2 mm, the distance between adjacent excitation electrode means on a surface being 0.1 mm, the length of each one of said excitation electrode means being 3.35 mm, and the length of each one of said extended portions of said excitation electrode means being 0.3 mm.

10. A piezoelectric resonator as claimed in claim 1, which further comprises said piezoelectric plate polarized in its thickness direction, said one pair of first and second excitation electrode means formed on the both surfaces of said piezoelectric plate and in registry with one another, said first and second peripheral electrode means formed on the both surfaces of said piezoelectric plate to connect with said first and second excitation electrode means by said first and second extended portion of said first and second excitation electrode means, respectively, additional third electrode means formed on the surface of said piezoelectric plate on which said first peripheral electrode means are formed and being in registry with, and short-circuited to, said second peripheral electrode means, and additional fourth electrode means formed on the surface of said piezoelectric plate on which said second peripheral electrode means are formed and being in registry with, and short-circuited to, said first peripheral electrode means.

11. A piezoelectric resonator as claimed in claim 10, which further comprises another pair of third and fourth excitation electrode means formed on the both surfaces of said piezoelectric plate in parallel with said one pair of first and second excitation electrode means and in registry with one another, said third excitation electrode means being on the surface of said piezoelectric plate on which said first excitation electrode means are formed, third portion extended from said third excitation electrode means towards said first peripheral electrode means to connect therebetween, said fourth excitation electrode means being on the surface of said piezoelectric plate on which said second excitation electrode means are formed, and fourth portion extended from said fourth excitation electrode means towards said second peripheral electrode means to connect therebetween.

12. A piezoelectric resonator as claimed in claim 11, wherein said first and third excitation electrode means are formed at a position corresponding to a zero point of the stress distribution due to the third-harmonic-mode width-extensional vibration, said second and fourth excitation electrode means formed at another position corresponding to another zero point of the stress distribution due to the third-harmonic mode width-extensional vibration.

13. A piezoelectric resonator as claimed in claim 10, wherein the length of said piezoelectric plate is about ten times of its width or more, the space between the spaced peripheral electrodes on each surface of said plate being about two or three times of the width of said piezoelectric plate, and the ratio of the width of each excitation electrode to that of said piezoelectric plate being about ½ or less.

14. A piezoelectric resonator as claimed in claim 10, wherein said piezoelectric plate is a $Pb(Zr-Ti)O_3$ ceramic plate, with a ratio of the width of said ceramic plate and the width of each one of said first and second excitation electrode means being 0.5 or less, the width of said ceramic plate being 2.63 mm, the length of said ceramic plate being 30 mm, the thickness of said ceramic plate being 0.2 mm, the length of each one of said excitation electrode means being 5.44 mm, and the length of each one of extended portions of said excitation electrode means being 0.55 mm.

15. A piezoelectric resonator as claimed in claim 10, wherein said piezoelectric plate is a $Pb(Zr-Ti)O_3$ ceramic plate, the width of said ceramic plate being 2.79 mm, the length of said ceramic plate being 30 mm, the thickness of said ceramic plate being 0.2 mm, the length of each one of said excitation electrode means being 5.44 mm, the width of each one of said excitation electrode means being 0.56 mm, and the length of each one of extended portions of said excitation electrode means being 0.55 mm.

16. A piezoelectric resonator as claimed in claim 11, wherein said piezoelectric plate is a $Pb(Zr-Ti)O_3$ ceramic plate, the width of said ceramic plate being 2.79 mm, the length of said ceramic plate being 30 mm, the thickness of said ceramic plate being 0.2 mm, the length of each one of said excitation electrode means being 5.44 mm, the width of each one of said excitation electrode means being 0.365 mm, the length of each one of extended portions of said excitation electrode means being 0.55 mm, and each one of the space between said first and third excitation electrode means and between said second and fourth excitation electrode means being 0.56 mm.

* * * * *